United States Patent
Yoshikawa

(10) Patent No.: US 6,180,479 B1
(45) Date of Patent: Jan. 30, 2001

(54) METHOD OF ETCHING TO FORM HIGH TOLERANCE POLYSILICON RESISTORS

(75) Inventor: Koichi Yoshikawa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/302,454

(22) Filed: Apr. 30, 1999

(30) Foreign Application Priority Data

May 21, 1998 (JP) ................................. 10-139757

(51) Int. Cl.⁷ ................................................. H01L 21/20
(52) U.S. Cl. ........................................ 438/384; 438/382
(58) Field of Search .................................. 438/382, 384, 438/763

(56) References Cited

U.S. PATENT DOCUMENTS

| 5,198,688 | * | 3/1993 | Tsuchiya et al. . | |
|---|---|---|---|---|
| 5,327,224 | * | 7/1994 | Ikegami et al. . | |
| 5,470,764 | * | 11/1995 | Ikegami et al. . | |
| 5,751,050 | | 5/1998 | Ishikawa et al. | 257/538 |
| 6,011,293 | * | 1/2000 | Yuzuriha et al. . | |

FOREIGN PATENT DOCUMENTS

| 42 44 771 C2 | * | 5/1996 | (DE) . |
|---|---|---|---|
| 59-168640 | | 9/1984 | (JP) . |
| 63-248157 | | 10/1988 | (JP) . |
| 5-275619 | | 10/1993 | (JP) . |
| 6-112410 | * | 4/1994 | (JP) . |
| 6-244152 | | 9/1994 | (JP) . |
| 6-295985 | * | 10/1994 | (JP) . |
| 9-55381 | | 2/1997 | (JP) . |
| 9-121024 | | 5/1997 | (JP) . |
| 9-129595 | | 5/1997 | (JP) . |
| 9-232521 | | 9/1997 | (JP) . |

* cited by examiner

*Primary Examiner*—Charles Bowers
*Assistant Examiner*—Evan Pert
(74) *Attorney, Agent, or Firm*—Foley & Lardner

(57) ABSTRACT

In a method of manufacturing a semiconductor device, a polysilicon resistance film is directly or indirectly formed on a semiconductor substrate. A first insulating film is formed on the polysilicon resistance film, and a second insulating film is formed on the first insulating film. An opening portion is formed to pass through the first insulating film and the second insulating film to expose the polysilicon resistance film. The first insulating film has an etching rate equal to or smaller than $\frac{1}{8}$ of an etching rate of the second insulating film.

22 Claims, 5 Drawing Sheets

METHOD OF ETCHING TO FORM HIGH TOLERANCE POLYSILICON RESISTORS

BACKGROUND OF THE INVENTION

1. Field of the Invention

The present invention relates to a method of manufacturing a semiconductor device, and more particularly to a method of manufacturing a semiconductor device in which a resistance layer is formed of polysilicon.

2. Description of the Related Art

Many resistance layers are formed in a semiconductor device, and a polysilicon layer is used as the resistance layer for high integration and high density. As shown in FIG. 1, a polysilicon film 103 is formed on the insulating films 101 and 102 formed on a silicon substrate 100 to have a desired pattern. An interlayer insulating film 106 is formed on the polysilicon layer 103. Contact holes are formed in the interlayer insulating film 106 so that wiring films 107 are connected to the polysilicon layer 103. Thus, the resistance film 103 of the polysilicon is formed.

It is conventionally known that the polysilicon resistance films formed thus have a variance in resistance. A method of suppressing the resistance variance is described in Japanese Laid Open Patent Application (JP-A-Heisei 9-232521).

Also, it is known that the resistance values of the polysilicon films have a variance when hydrogen atoms are diffused into the polysilicon resistance film. To prevent the resistance variance due to the diffusion of hydrogen atoms, a technique is known in which a silicon nitride film is formed on the surface of the polysilicon resistance film.

However, impurity ions which have been implanted into the polysilicon resistance film to decrease a contact resistance are diffused into a resistance region of the polysilicon resistance film in a thermal process for the forming of the silicon nitride film. As a result, the resistance variance occurs. A method of preventing such a resistance variance is known in Japanese Laid Open Patent Application (JP-A-Heisei 9-121024).

The resistance variance of the polysilicon resistance film is also based on a variance of contact resistance. That is, as shown in FIG. 1, when the contact hole is formed by a plasma etching method, an opening portion of the polysilicon resistance film is cut because of over-etching, so that the contact resistance variance occurs.

Therefore, it is desired that the damage of the polysilicon resistance film because of the over-etching in the case of forming the contact hole is restrained so that the variance in contact resistance of the polysilicon film is retrained.

SUMMARY OF THE INVENTION

The present invention is accomplished based on such technical problems. Therefore, an object of the present invention is to provide a method of manufacturing a semiconductor device, in which a variance in a contact resistance of a polysilicon resistance film can be restrained.

Another object of the present invention is to provide a method of manufacturing a semiconductor device, in which a variance in a sheet resistance of a polysilicon resistance film can be restrained.

In order to achieve an aspect of the present invention, a method of manufacturing a semiconductor device includes:

forming a polysilicon resistance film directly or indirectly on a semiconductor substrate;

forming a first insulating film on the polysilicon resistance film;

forming a second insulating film on the first insulating film; and forming an opening portion to pass through the first insulating film and the second insulating film to the polysilicon resistance film. The first insulating film has an etching rate equal to or smaller than ⅛ of an etching rate of the second insulating film The first insulating film is a nitride film, and the nitride film has a film thickness of 40 Å to 200 Å. The first insulating film is formed on the polysilicon resistance film by an annealing method at a temperature of 600° C. to 630° C.

The second insulating film is one of an oxide film, a BSG film and a BPSG film.

When the opening portion is formed, the first and second insulating film are etched with the same etching conditions.

The polysilicon resistance film has a film thickness of 1500 to 3000 Å.

In order to achieve another aspect of the present invention, a method of manufacturing a semiconductor device includes:

forming a polysilicon resistance film directly or indirectly on a semiconductor substrate;

forming an oxide film on the polysilicon resistance film;

forming a first insulating film on the oxide film;

forming a second insulating film on the first insulating film; and forming an opening portion to pass through the first insulating films the second insulating film, and oxide film to the polysilicon resistance film. The first insulating film has an etching rate equal to or smaller than ⅛ of the etching rate of the second insulating film.

In order to achieve still another aspect of the present invention, a method of manufacturing a semiconductor device includes:

forming a polysilicon resistance film directly or indirectly on a semiconductor substrate;

forming a first insulating film through an annealing process at a temperature of 600° C. to 630° C. to cover the polysilicon resistance film;

forming a second insulating film on the first insulating film; and forming an opening portion to pass through the first insulating film and the second insulating film to the polysilicon resistance film. The first insulating film has an etching rate equal to or smaller than ⅛ of an etching rate of the second insulating film.

DESCRIPTION OF THE PREFERRED EMBODIMENTS

Next, a method of manufacturing a semiconductor device of the present invention will be described below in detail with reference to the attached drawings.

First, referring to FIGS. 2A to 2G, the method of manufacturing the semiconductor device according to the first embodiment of the present invention will be described.

Figure 1:
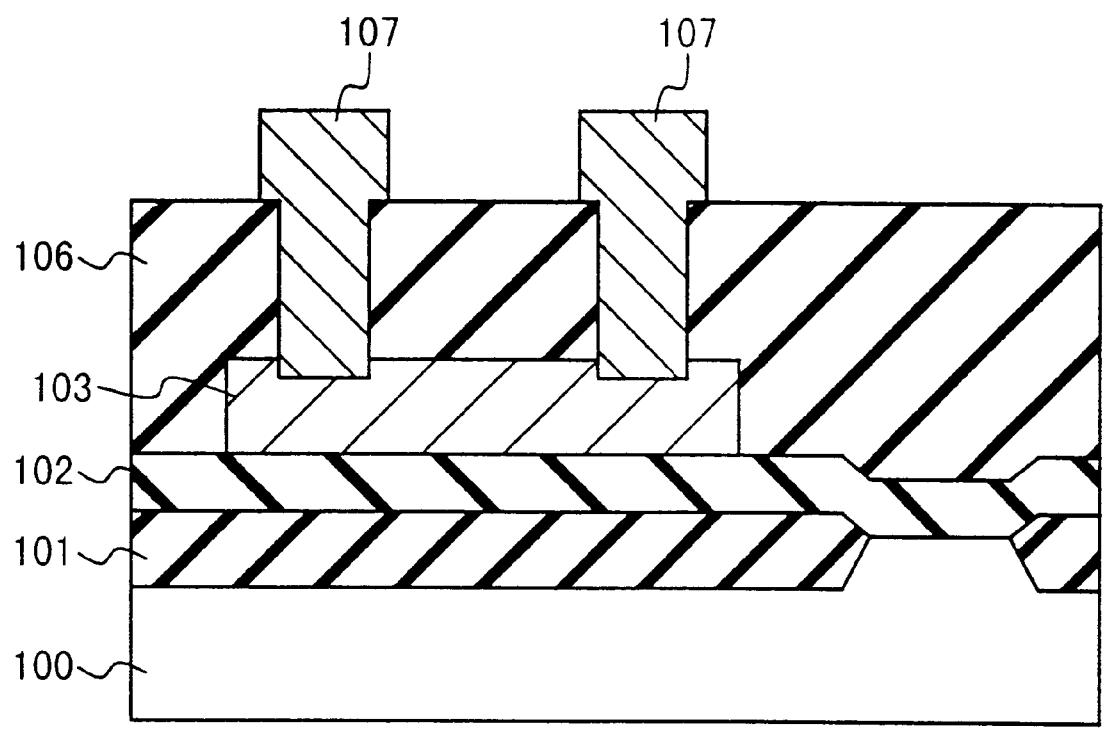
FIG. 1 is a cross sectional view illustrating a semiconductor device formed by conventional manufacturing method.
Figure 2A:
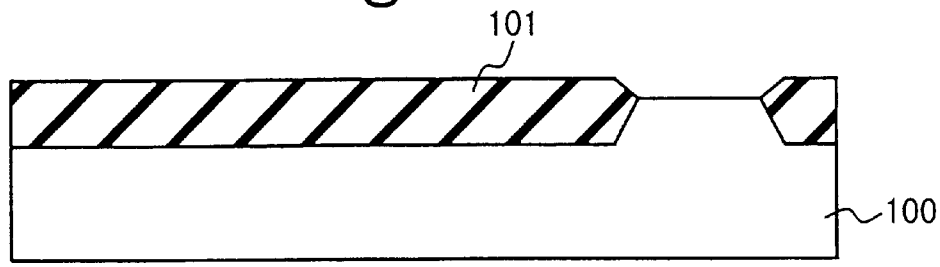
FIGS. 2A to 2G are cross sectional views of a semiconductor device formed by a manufacturing method according to a first embodiment of the present invention.

As shown in FIG. 2A, a field oxide film 101 is formed on a semiconductor substrate 100 as an element separation region. The field oxide film 101 has the film thickness of 2500 Å to 5000 Å. Thus, an element formation region is defined.

Figure 2B:
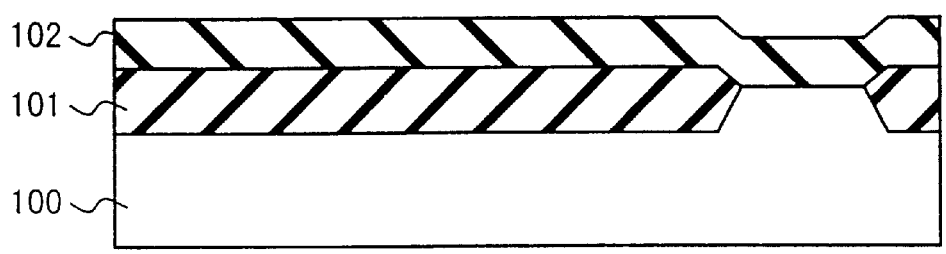

As shown in next FIG. 2B, after the element formation region is defined, a first interlayer insulating film 102 is formed on the semiconductor substrate 100 and the field oxide film 101. The first interlayer insulating film 102 has the film thickness of 1000 Å to 2000 Å.

Figure 2C:
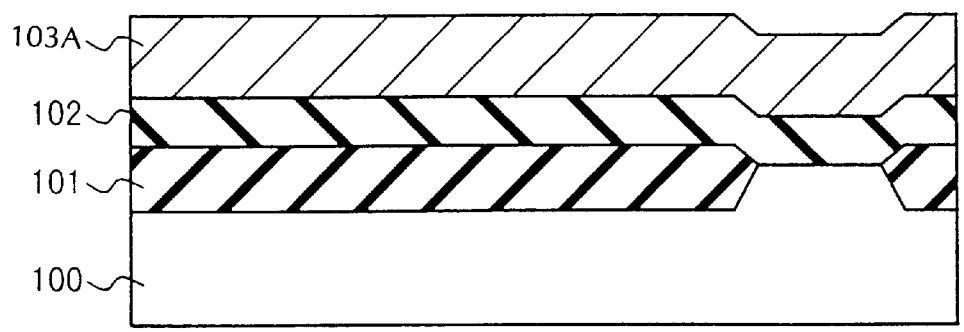

Next, as shown in FIG. 2C, a polysilicon layer 103A is deposited for a polysilicon resistance film 103 on the first interlayer insulating film 102 to have the film thickness of 1500 Å to 3000 Å. Boron (B) ions are implanted into the polysilicon resistance layer to control the sheet resistance.

Figure 2D:
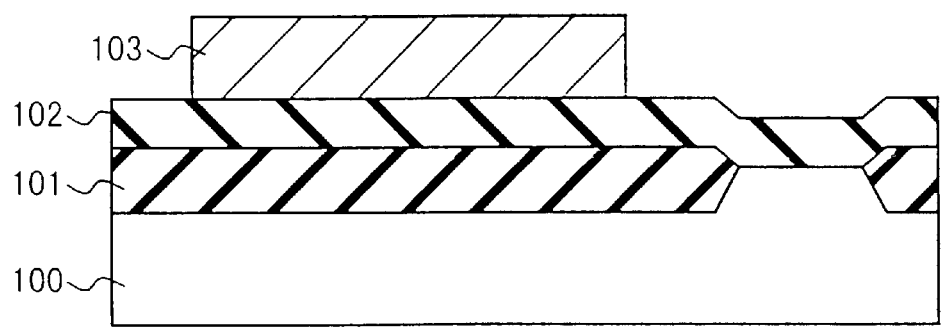

Next, as shown in FIG. 2D, the polysilicon resistance film 103 is selectively formed by the PR (photoresist) and a plasma etching method.

Figure 2E:
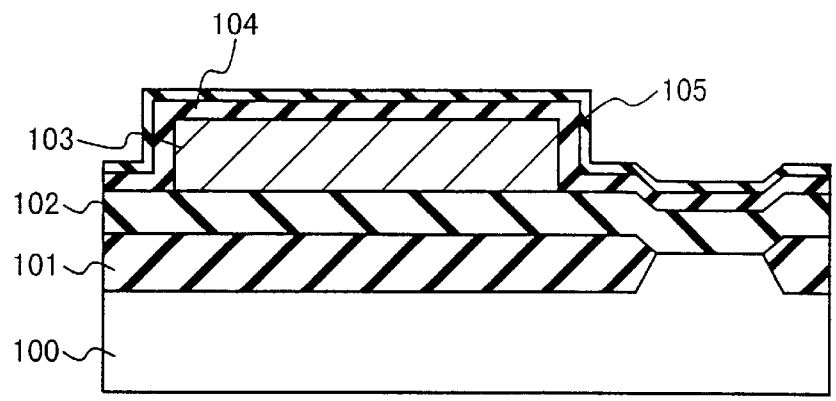

Next, as shown in FIG. 2E, an oxide film 104 is formed on the polysilicon resistance film 103 and the first interlayer insulating film 102. The film thickness of the oxide film 104 is in a rage of 200 Å to 1000 Å.

A nitride film 105 is formed on the oxide film 104. The film thickness of the nitride film 105 is in a range of 40 Å to 200 Å. When the nitride film 105 is grown, a low temperature annealing process is carried out. That is, a depositing process is carried out at a temperature of 600° C. to 630° C. Through the low temperature annealing process, the boron ions are diffused into the whole polysilicon resistance film 103. Also, the damage due to ion implantation is healed. Thus, the variance in resistance of the polysilicon resistance film 103 and contact resistance can be reduced.

The reason why a high temperature annealing process can not be applied is as follows. That is, before the formation of the polysilicon resistance film 103, a transistor is formed. However, a $TiSi_2$ layer of the transistor is made to cohesion such that the diffusion layer resistance increases, when the high temperature annealing process is carried out.

Figure 2F:
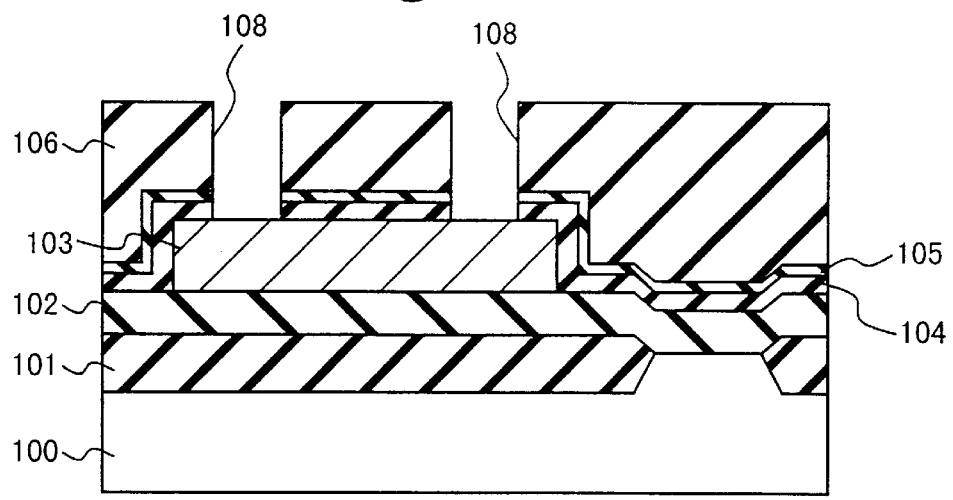

Next, as shown in FIG. 2F, a second interlayer insulating film 106 is formed on the nitride film 105. For example, the second interlayer insulating film 106 is formed of one of a BPSG film, a BSG film and an oxide film.

Next, contact holes 108 are formed by a PR and a plasma etching method to pass through the second interlayer insulating film 106, the nitride film 105 and the oxide film 104 to the polysilicon resistance film 103. The contact holes 108 are used to provide electrical connections to the polysilicon resistance film 103.

The condition of the plasma etching method in this case is identical for each of the second interlayer insulating film 106, the nitride film 105 and the oxide film 104. The pressure is in a range of 30 to 40 mT, the RF electric power is in a range of 1000 to 2000 W, and the etching gas is composed of $C_4F_8$ of 15 to 25 sccm, $O_2$ of 10 to 15 sccm and Ar of 500 to 600 sccm.

The etching rate of the plasma etching method carried out in the above condition is as follows. That is, the etching rate is 6000 to 8000 Å/min in the BPSG film, 5000 to 8000 Å/min in the BSG film, 5000 to 7000 Å/min in the oxide film and 600 to 700 Å/min in the nitride film. In this way, the nitride film has an etching rate equal to or less than 1⁄8 of any the BPSG film, the BSG film, and the oxide film. The nitride film 105 exists between the second interlayer insulating film 106 (composed of one of the BPSG film, the BSG film, and the oxide film) and the polysilicon resistance layer 103. Therefore, the over-etching of the polysilicon resistance layer 103 can be restrained, so that the variance in contact resistance can be suppressed.

Figure 2G:
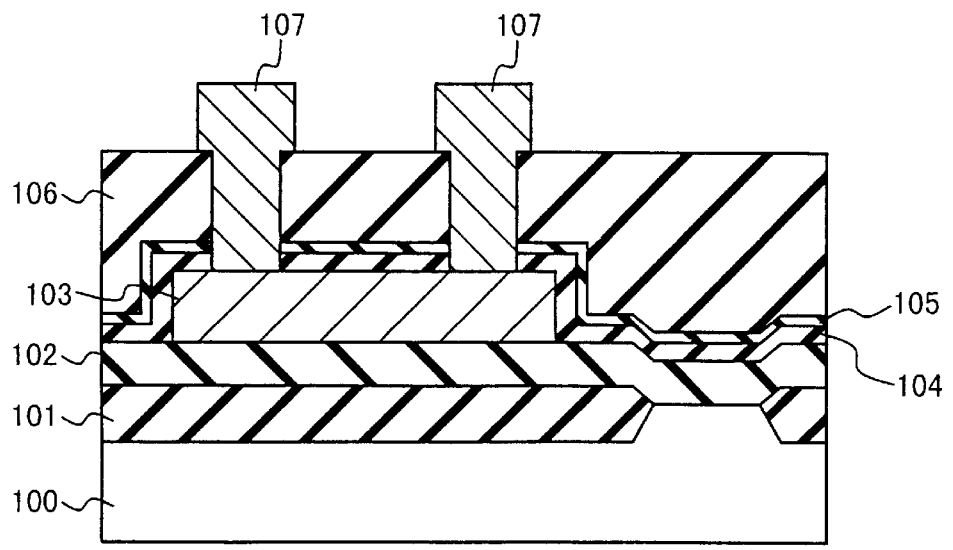

Next, as shown in FIG. 2G, first wiring films 107 are formed in the contact holes 108 to be in contact with the polysilicon resistance film 103. Then, the first wiring film 107 is selectively patterned by PR using the plasma etching method.

According to the first embodiment, in the case where the contact hole 108 is formed by the plasma etching method, the damage of the polysilicon resistance film 103 due to the over-etching to the polysilicon resistance layer 103 can be restrained by means of the nitride film 105. Thus, the cutting of the opening portion of the contact hole 108 to the polysilicon resistance layer 103 can be restrained. As a result, the variance in contact resistance of the polysilicon resistance film 103 can be restrained.

Moreover, according to the first embodiment, the variance in the layer resistance and the contact resistance of the polysilicon resistance layer 103 can be reduced as the result of the low temperature annealing process when the nitride film 105 is grown.

Next, the method of manufacturing a semiconductor device according to the second embodiment of the present invention will be described below with reference to FIGS. 3A to 3G.

Figure 3A:
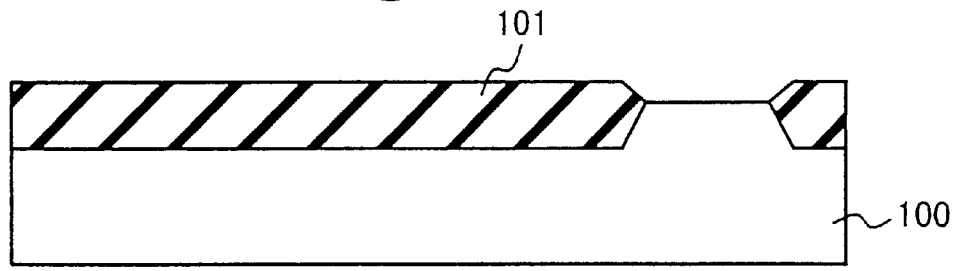
FIGS. 3A to 3G are cross sectional views of a semiconductor device fromed by a manufacturing method according to a second embodiment of the present invention.

As shown in FIG. 3A, the field oxide film 101 as the element separation region is formed on the semiconductor substrate 100. The film thickness of the field oxide film 101 is in a range of 2500 Å to 5000 Å. Thus, the element formation region is defined.

Figure 3B:
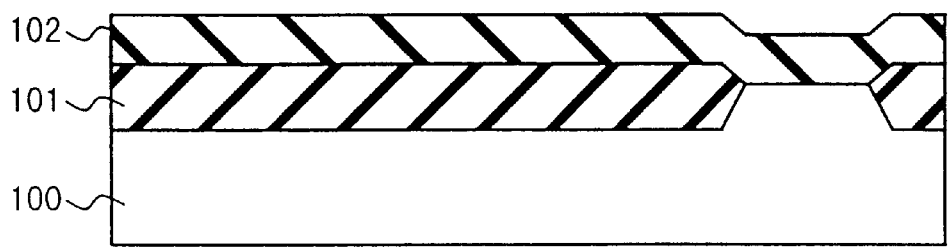

Next, as shown in FIG. 3B, after the element formation region is formed, the first interlayer insulating film 102 is formed on the semiconductor substrate 100 and the field oxide film 101 to have the film thickness of 1000 Å to 2000 Å.

Figure 3C:
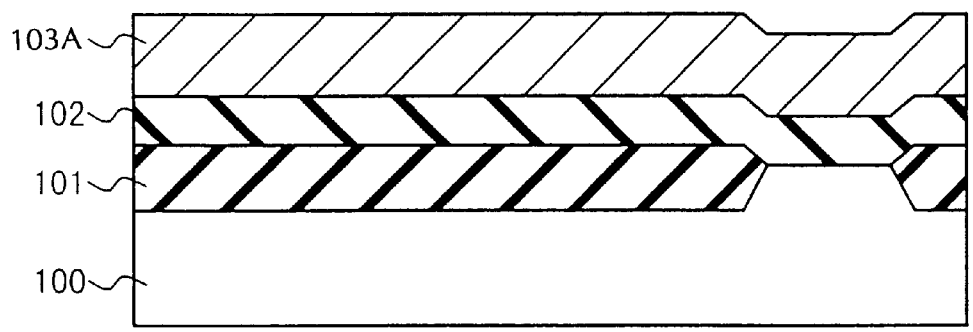

Next, as shown in FIG. 3C, the polysilicon layer 103A is formed for forming the polysilicon resistance film 103 on the first interlayer insulating film 102 to have the film thickness of 1500 Å to 3000 Å. Boron ions are injected into the polysilicon resistance layer by an ion implantation method to control the sheet resistance.

Figure 3D:
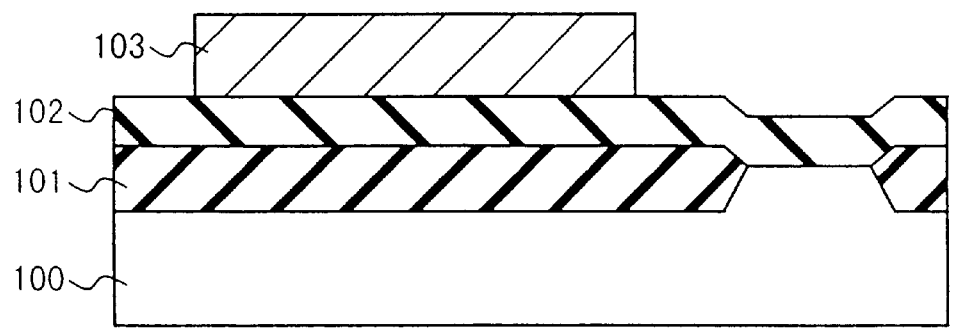

Next, as shown in FIG. 3D, the polysilicon layer 103A is selectively patterned by PR (photoresist) using the plasma etching method to produce the polysilicon resistance film 103.

Figure 3E:
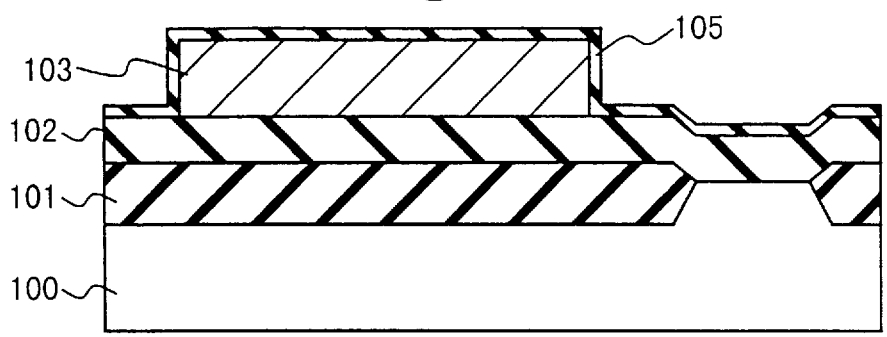

Next, as shown in FIG. 3E, the nitride film 105 is formed on the polysilicon resistance film 103 and the first interlayer insulating film 102. The film thickness of the nitride film 105 ranges from 40 Å to 200 Å. For growth of the nitride film 105, the above low temperature process is carried out.

Figure 3F:
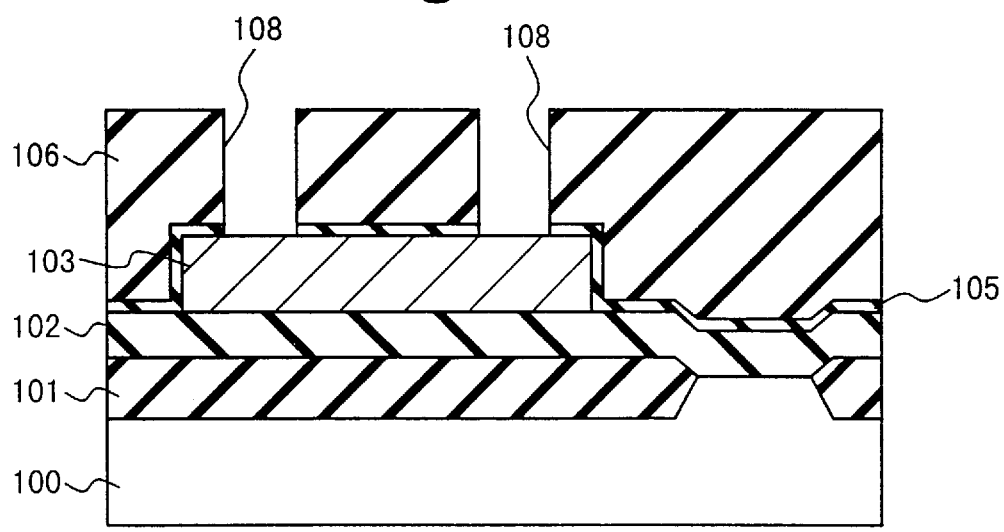

Next, as shown in FIG. 3F, the second interlayer insulating film (BSG film) 106 is formed on the nitride film 105. Subsequently, the contact holes 108 are opened the plasma etching method to pass through the second interlayer insulating film 106 and the nitride film 105 to the polysilicon resistance film 103. The contact hole 108 is used for electrical connection to the polysilicon resistance film 103. The etching condition in this case is the same as that of the first embodiment.

Figure 3G:
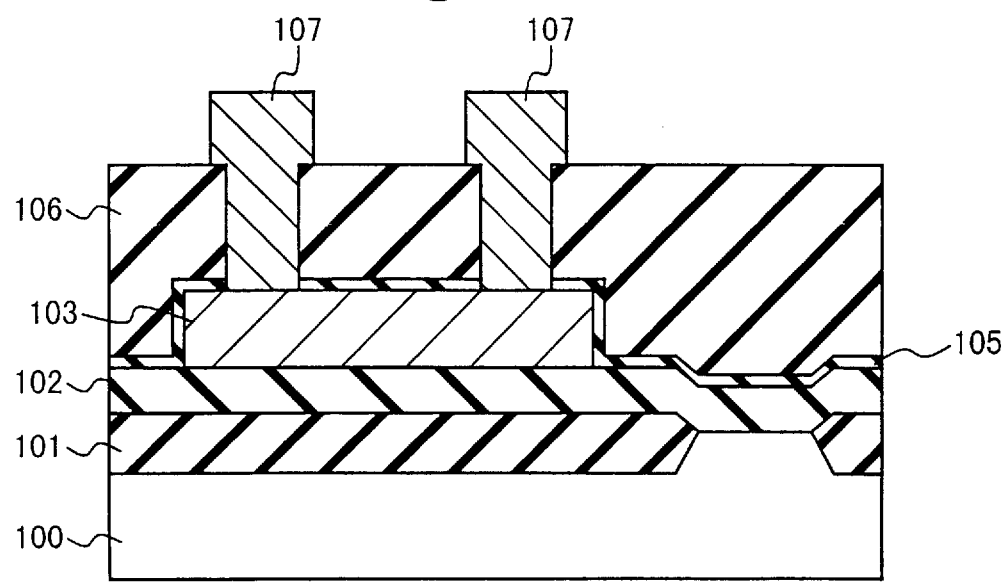

Next, as shown in FIG. 3G, the wiring layer is formed in the contact hole 108 to be in contact with the polysilicon resistance film 103. Then, the first wiring layer is selectively patterned by PR and using the plasma etching method to produce wiring films 107.

According to the second embodiment, like the first embodiment, in the case that the opening of the contact hole 108 is performed by the plasma etching method, damage of the polysilicon resistance film 103 due to over-etching into the polysilicon resistance film 103 can be restrained by the nitride film 105. By this, the cutting of the opening portion of the contact hole 108 in the polysilicon resistance film 103 can be restrained. As a result, the variance in the contact resistance in the polysilicon resistance film 103 can be restrained.

Also, according to the second embodiment, since the nitride film 105 is formed by the low temperature annealing method, the variance in the layer resistance and the contact resistance in the polysilicon resistance film 103 can be decreased.

According to the method of manufacturing the semiconductor device of the present invention, the polysilicon resistance film is formed on the semiconductor substrate, the first insulating film is formed on the polysilicon resistance film, and then the second insulating film is formed on the first insulating film. When the contact hole is formed to pass through the first and second insulating films to the polysilicon resistance film, the over-etching of the polysilicon resistance film can be prevented because the etching rate of the first insulating film is equal to or smaller than $1/8$ of the etching rate of the second insulating layer. The first insulating film is desirable to be a nitride film and the second insulating film is desirable to be an oxide film, a BSG film or a BPSG film.

What is claimed is:

1. A method of manufacturing a semiconductor device comprising:

forming a polysilicon resistance film directly or indirectly on a semiconductor substrate;

forming a first insulating film on said polysilicon resistance film;

forming a second insulating film on said first insulating film; and forming an opening portion to pass through said first insulating film and said second insulating film to said polysilicon resistance film, wherein said first insulating film has an etching rate equal to or smaller than $1/8$ of an etching rate of said second insulating film.

2. A method according to claim 1, wherein said first insulating film is a nitride film.

3. A method according to claim 2, wherein said nitride film has a film thickness of 40 Å to 200 Å.

4. A method according to claim 1, wherein said step of forming a first insulating film includes forming said first insulating film on said polysilicon resistance film by an annealing method at a temperature of 600° C. to 630° C.

5. A method according to claim 1, wherein said second insulating film is one of an oxide film, a BSG film and a BPSG film.

6. A method according to claim 1, wherein said step of forming an opening portion includes:

etching said first and second insulating film with the same etching conditions.

7. A method according to claim 1, wherein said polysilicon resistance film has a film thickness of 1500 to 3000 Å.

8. A method of manufacturing a semiconductor device comprising:

forming a polysilicon resistance film directly or indirectly on a semiconductor substrate;

forming an oxide film on said polysilicon resistance film;

forming a first insulating film on said oxide film;

forming a second insulating film on said first insulating film; and forming an opening portion to pass through said first insulating films said second insulating film, and said oxide film to said polysilicon resistance film, wherein said first insulating film has an etching rate equal to or smaller than $1/8$ of an etching rate of said second insulating film.

9. A method according to claim 8, wherein said first insulating film is a nitride film.

10. A method according to claim 9, wherein said nitride film has a film thickness of 40 Å to 200 Å.

11. A method according to claim 8, wherein said step of forming a first insulating film includes forming said first insulating film on said polysilicon resistance film by an annealing method at a temperature of 600° C. to 630° C.

12. A method according to claim 8, wherein said second insulating film is one of an oxide film, a BSG film and a BPSG film.

13. A method according to claim 8, wherein said step of forming an opening portion includes:

etching said first and second insulating film with the same etching conditions.

14. A method according to claim 8, wherein said polysilicon resistance film has a film thickness of 1500 to 3000 Å.

15. A method of manufacturing a semiconductor device comprising:

forming a polysilicon resistance film directly or indirectly on a semiconductor substrate;

forming a first insulating film through an annealing process at a temperature of 600° C. to 630° C. to cover said polysilicon resistance film;

forming a second insulating film on said first insulating film; and forming an opening portion to pass through said first insulating film and said second insulating film to said polysilicon resistance film.

16. A method according to claim 15, wherein said first insulating film is a nitride film.

17. A method according to claim 16, wherein said nitride film has a film thickness of 40 Å to 200 Å.

18. A method according to claim 15, wherein said second insulating film is one of an oxide film, a BSG film and a BPSG film.

19. A method according to claim 15, wherein said step of forming an opening portion includes:

etching said first and second insulating film with the same etching conditions.

20. A method according to claim 15, wherein said polysilicon resistance film has a film thickness of 1500 to 3000 Å.

21. A method according to claim 15, further comprising forming an oxide film on said polysilicon resistance film, said first insulating film being formed on said oxide film.

22. A method according to claim 15, wherein said first insulating film has an etching rate equal to or smaller than $1/8$ of an etching rate of said second insulating film.

* * * * *